United States Patent
Pippers

(10) Patent No.: US 9,825,623 B2
(45) Date of Patent: Nov. 21, 2017

(54) SWITCHABLE FREQUENCY FILTER

(71) Applicant: Rohde & Schwarz GmbH & Co. KG, Munich (DE)

(72) Inventor: Simon Pippers, Munich (DE)

(73) Assignee: ROHDE & SCHWARZ GMBH & CO. KG, Munich (DE)

(*) Notice: Subject to any disclaimer, the term of this patent is extended or adjusted under 35 U.S.C. 154(b) by 0 days.

(21) Appl. No.: 14/827,041

(22) Filed: Aug. 14, 2015

(65) Prior Publication Data
US 2016/0049929 A1 Feb. 18, 2016

(30) Foreign Application Priority Data

Aug. 18, 2014 (DE) .................. 10 2014 216 328
Oct. 13, 2014 (DE) .................. 10 2014 220 640

(51) Int. Cl.
*H03K 17/16* (2006.01)
*H03H 7/01* (2006.01)
*H01P 1/203* (2006.01)

(52) U.S. Cl.
CPC .......... *H03K 17/16* (2013.01); *H01P 1/2039* (2013.01); *H03H 7/0153* (2013.01)

(58) Field of Classification Search
CPC ..... H03K 17/16; H01P 1/2039; H03H 7/0153
USPC .............. 333/32–34, 138–212; 327/524–602
See application file for complete search history.

(56) References Cited

U.S. PATENT DOCUMENTS

| | | | |
|---|---|---|---|
| 6,452,465 B1* | 9/2002 | Brown | H01P 1/20381 333/205 |
| 7,049,907 B2* | 5/2006 | Gurvich | H03F 1/3229 333/139 |
| 7,260,424 B2* | 8/2007 | Schmidt | H01Q 1/241 343/702 |
| 7,583,950 B2* | 9/2009 | Russell | H03H 7/0115 455/290 |
| 8,299,876 B2* | 10/2012 | Lin | H01P 1/20345 333/204 |
| 2002/0097112 A1* | 7/2002 | Liang | H01P 1/20336 333/134 |
| 2005/0184828 A1* | 8/2005 | Son | H03H 7/0115 333/174 |
| 2006/0001492 A1* | 1/2006 | Chang | H03F 3/191 330/306 |
| 2006/0055585 A1* | 3/2006 | Nagasaku | G01S 13/347 342/28 |
| 2008/0129421 A1 | 6/2008 | Ninan et al. | |
| 2009/0213025 A1* | 8/2009 | Coupez | H01Q 9/28 343/807 |
| 2010/0244978 A1 | 9/2010 | Milosavljevic et al. | |
| 2013/0267943 A1* | 10/2013 | Hancock | A61B 18/042 606/33 |
| 2013/0307640 A1* | 11/2013 | Wada | H01P 1/20381 333/134 |

(Continued)

*Primary Examiner* — Brandon S Cole
(74) *Attorney, Agent, or Firm* — Ditthavong & Steiner, P.C.

(57) ABSTRACT

The invention relates to a filter, for example, a switchable harmonic filter for the gigahertz range. A first line segment, which can comprise a radial stub leads away from a main line of the filter. A second line segment can be electrically connected to the first line segment. At least two electronically controllable switching elements are provided, by means of which the first and the second line segment can be connected.

13 Claims, 8 Drawing Sheets

(56) References Cited

U.S. PATENT DOCUMENTS

2015/0061091 A1* 3/2015 Seler ...................... H01L 24/18
257/664

* cited by examiner

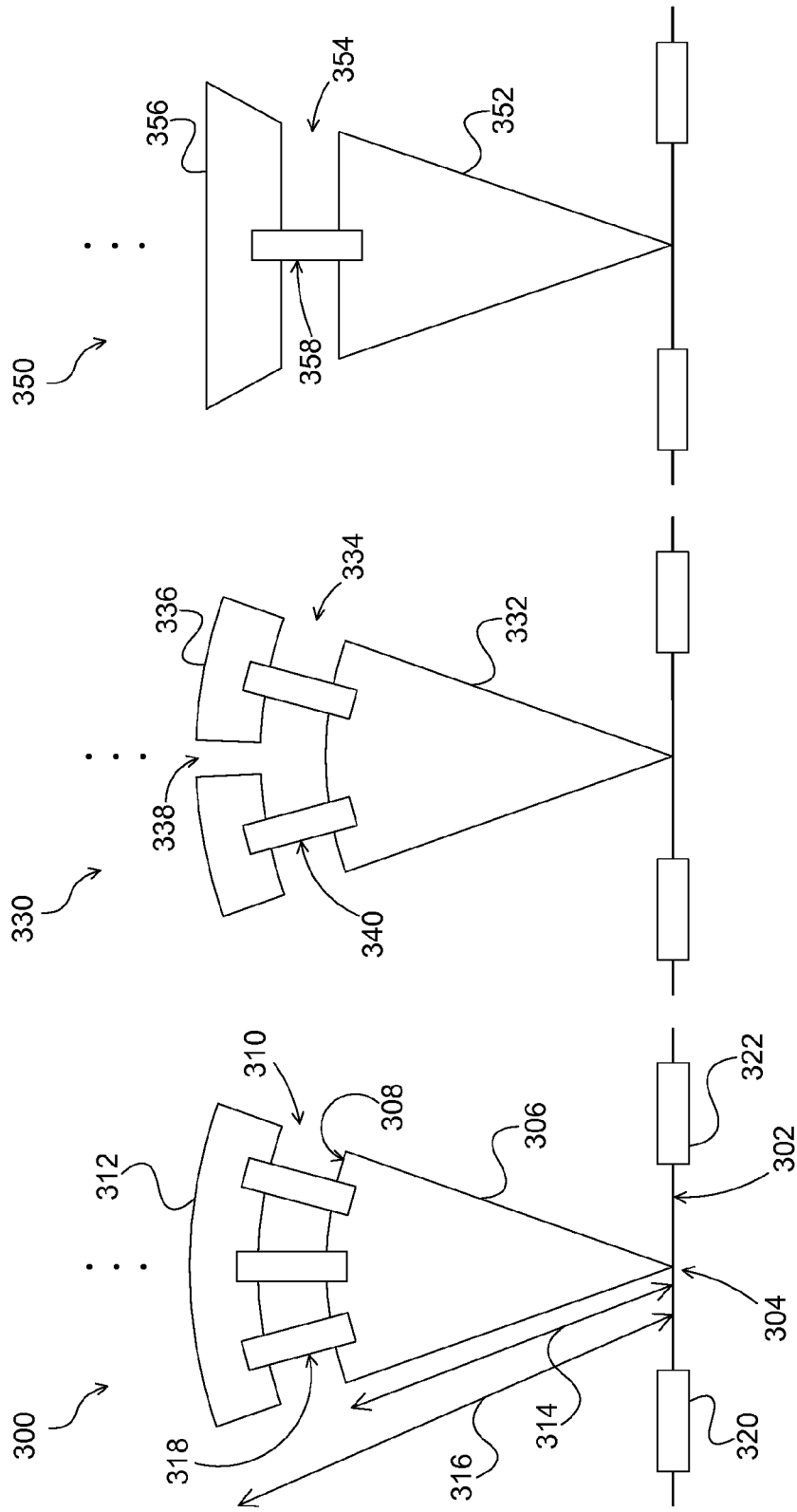

SWITCHABLE FREQUENCY FILTER

PRIORITIES

This application claims priorities of German patent applications DE 10 2014 216 328.5 filed on Aug. 18, 2014 and DE 10 2014 220 640.5 filed on Oct. 13, 2014, which are incorporated by reference herewith.

FIELD OF THE INVENTION

The invention relates to filters for filtering out a frequency band from an electrical signal, especially a high-frequency signal, transmitted via a line. The invention relates especially to switchable filters in which it is possible to switch between different frequency bands to be filtered, or respectively in which the frequency band to be filtered can be adjusted. Accordingly, the invention relates, for example, to switchable harmonic filters for the gigahertz range, such as are used, for example, for microwave signal generators.

BACKGROUND OF THE INVENTION

The applicant uses various topologies internally in order to design the effective cut-off frequency of a (low-pass) filter in a variable manner, that is, in an adjustable or switchable manner. For example, a filter bank which comprises several filters with different cut-off frequencies can be provided. The desired frequency band and/or the desired cut-off frequency are addressed by means of switches. However, the space requirement for solutions of this kind is large. The payload signal is often comparatively strongly attenuated by the switches used, and/or only payload signals of comparatively low power can be connected.

Preferred solutions for switchable filters should be capable of filter-internal and electronic switching. Such topologies are already used by the applicant, but in this case, for example, large reverse voltages can occur in switching diodes. As a result, the power consumption of the corresponding filter is limited to the breakdown voltage of the diode. A further problem may be that with these or other topologies, the power consumption of the overall circuit is limited by the maximal possible current consumption of the switch. Parasitic effects of the switches used or of their configuration are often not small enough by comparison with reactance values of resonator elements, so that the filter characteristic is negatively influenced by these effects.

Improved switching topologies should place reduced large-signal requirements on the switches and should be insensitive to switch parasitic effects.

US 2008/0129421 A1 describes an adjustable blocking filter with a transmission line and a switching element for the selective connection of the transmission line to ground. The switching element can comprise a PIN diode (Positive Intrinsic Negative Diode). Furthermore, a biasing circuit is provided for the switching element. It is proposed that the length of the transmission line is selected in such a manner that a first frequency is suppressed when the transmission line is connected to ground. By contrast, a second frequency is suppressed when the transmission line is not connected to ground. The transmission line can be implemented in the form of several transmission lines connected to the switching element in series.

The invention has the object among others of specifying a filter capable of switching in a filter-internal and electronic manner, especially for the gigahertz range, which achieves a high power consumption, which is as insensitive as possible to switch parasitic effects, and which places reduced large-signal requirements on the switches used.

SUMMARY OF THE INVENTION

According to one aspect of the invention, a changeover filter for filtering out a variable frequency band from a signal is proposed, in which the signal is guided via an electrical main line from an input to an output of the filter. The filter provides a first line segment which leads away from the main line. Furthermore, the filter provides at least one second line segment which can be electrically connected to the first line segment. At least two electronically controllable switching elements are provided, by means of which the first and the at least one second line segment can be connected.

The signal can preferably be a high-frequency signal (RF signal) and can have, for example, desired signal components in the frequency range above 10 megahertz (MHz), 100 MHz, 1 gigahertz (GHz), 10 GHz or more. The frequency band to be filtered can be determined especially by its (lower) cut-off frequency. This cut-off frequency can assume different values dependent upon the adjustment of the switchable filter. At least one cut-off frequency can be disposed, for example, within the range from 100 MHz to 1 GHz, or within the range from 1 GHz to 10 GHz, or in an even higher frequency range. A set of adjustable cut-off frequencies can comprise, for example, values of 3 GHz, 6 GHz and 12 GHz. Another set can comprise values of 8.5 GHz, 12 GHz, 15 GHz and 20 GHz.

The main line can preferably be a transmission line with optimised properties for signal rerouting, as is known to the person skilled in the art, for example, in the field of high-frequency technology. In this context, the relevant frequencies are especially, but not exclusively, in the radio frequency range ("Radio Frequency", RF) especially in the microwave range. Examples of concrete frequencies and frequency ranges are named above and elsewhere. The main line can be, for example, a coaxial cable, a microstrip, a strip line, a twisted-pair line or combinations of the above.

Each line segment can preferably provide a resonator or respectively a resonance circuit or a part or an element of such a resonator. A resonator can be especially an LC resonance circuit or an RLC circuit, wherein "L" denotes an inductive aspect or respectively inductance, "C" denotes a capacitive aspect or respectively capacitance and "R" denotes an ohmic aspect or a resistance.

Preferred embodiments of changeover filters according to the invention can realise an elliptical filter characteristic. With some of these embodiments, the resonator, that is, the first and/or second line segment can be switched to ground or respectively connected to ground.

A resonator can preferably comprise several individual elements, such as, for example, a coil and a capacitor. In a frequency range, for example, in the GHz range, parasitic reactance values of real components can be of the same order of magnitude as desired reactance values. A resonator for such a frequency range can therefore comprise only a single element, for example, a coil, if its parasitic capacitance is sufficient. A resonator can also comprise a line section, that is, one or more first or respectively second line segments. If broadband resonators are required, the line sections or respectively segments will be wider than a transmission line, that is, wider than the main line.

Each first and/or second line segment can preferably comprise one resonator or several resonators. Several resonators can be coupled electromagnetically and/or with coupling elements. The coupling elements can comprise active and/or passive electrical elements. If a line segment contains several resonators, they can be connected in series and/or in parallel. Resonance frequencies of the individual resonators which are realised by the first and/or second line segments need not be identical.

The first and the second line segment can preferably be interconnected by the switching elements. The at least two switching elements can be connected in parallel or respectively can be capable of parallel connection. If the first line segment provides a first resonator and the second line segment provides a second resonator, the connection of the second resonator to the first resonator will displace the resonance frequency of the resulting resonator towards relatively lower frequencies. If the inductance and capacitance of the first or respectively second line segment is designated with $L_1$ and $C_1$ or respectively $L_2$ and $C_2$, a connection or respectively an interconnection leads to an inductance of the resulting LC resonance circuit $L_{res}=L_1+C_2*(C_2/C_1+C_2)$ and a capacitance $C_{res}=C_1+C_2$ (influences of the circuit are ignored in this context).

A switching element can preferably comprise, for example, the following: a relay, an FET (field-effect transistor), a diode, such as a PIN diode, a MEM (microelectrical-mechanical element), a transistor, such as a bipolar transistor, a plurality and/or a combination of these elements etc.

With preferred embodiments of changeover filters according to the invention, each switching element can be connected directly to the first line segment, in each case for itself, that is, each switching element can produce a separate or respectively autonomous electrical connection between the first line segment and the second line segment or every second line segment. For example, if a first and a second line segment can be connected by two switching elements, and if both switching elements are connected in parallel, the current carrying capacity of the filter is increased correspondingly. Dependent upon the details of the circuit topology, this can also apply if a first switching element of the two switching elements connects the first line segment to one of two second line segments, and a second switching element of the two switching elements connects the first line segment to the other line segment of the two second line segments.

The electronic biasing of a switching element can preferably take place via a biasing circuit. For example, a PIN diode can be DC biased. The biasing circuits for the switching elements can be provided completely independently of one another, or can provide common elements, for example, a common DC-voltage feed.

With given preferred embodiments of changeover filters according to the invention, a switching element can be biased via the second line segment. For example, a DC voltage can bias the switching element beyond the second line segment. In this manner, an additional control line can be dispensed with.

At least one line segment can preferably comprise a stub. Such a stub can be embodied, for example, with a constant width, wherein the width can differ from the width of the main line. The stub can, for example, be wider than the main line. The stub can be connected in a linear manner to the main line, that is, the entire side, for example, of a rectangular stub can be connected to the main line.

With other preferred embodiments, the stub can be realised especially as a radial stub. In this context, the stub provides a narrow end and a wide end, and the line width widens in its course from the narrow end of the stub to the wide end, that is, the line width increases over its course. The course of the widening can be continuous or discontinuous.

With exemplary radial stubs with continuous widening, the line has, for example, a widening extending in a concave or convex manner, that is, it can have, for example, the shape of a circular sector with a curved wide end, that is, the geometric shape of a pie slice. Other embodiments have the shape of a triangle with a rectilinear wide end. Geometric parameters of the stub, such as the widening angle or respectively opening angle, which specifies the degree of widening, and a length of the stub determine electrical parameters, such as the resonance frequency of the resonance circuit realised by the radial stub.

With exemplary radial stubs with discontinuous widening, the line provides, for example, an abrupt or irregular widening, that is, it can have, for example, a narrow course with an immediately adjoining rectangular or square assignment.

With some preferred embodiments, the wide end of the radial stub is embodied as a line section with constant width, or respectively, it is a line element of constant width adjoining a widening. This shape can be advantageous for a radial stub which embodies the first line segment or is associated with the latter. One, two or more switching elements can then be attached to the line section of constant width.

With some preferred embodiments, in which, in each case, the first line segment provides a radial stub, the latter is rigidly connected at a narrow end to a connecting point of the main line. The wide end can be open (open circuit). With other embodiments, for example, those which are implemented through an elliptical filter characteristic, the wide end or respectively the line segment as such is connected to ground, for example, via a capacitance.

With given preferred embodiments, a switching element can be connected to the wide end of the radial stub. The latter can, for example, connect the first line segment selectively to the second line segment, with corresponding changes in the resonance properties.

With many preferred embodiments, at least two switching elements are connected separately in each case to the wide end of the radial stub. The two switching elements can produce a connection to one and the same second line segment or to two separate second line segments. In each case, they increase a maximal current consumption of the filter. This applies in a corresponding manner if three, four or even more switching elements are provided.

The second line segment or each second line segment can preferably be embodied, for example, as a line section, annular segment, trapeze, and/or as a wedge-shaped section. For example, the second line segment can be embodied as a trapezoidal line segment behind a straight wide end of a radial stub of the first line segment. In the case of an additional or alternative embodiment, the second line segment can be arranged in the form of a circular segment behind a curved wide end of a radial stub of the first line segment.

For instance, a second line segment can preferably continue a radial stub of the first line segment in such a manner that, geometrically, a pie slice or triangle is obtained, which is subdivided by an unassigned gap. The gap can be bridged by one, two or more switching elements.

Several second line segments can preferably also continue a radial stub of the first line segment. For example, several second line segments in the form of mutually adjacent circular segments can be arranged behind a curved wide end of a radial stub. In this manner, a circular segment or triangle subdivided by several gaps can be obtained. Each second line segment can be connectable by at least one switching element to the first line segment. In this manner, for example, a radial stub can be embodied in an expandable manner through the switching elements, that is to say, a parameter, such as a length or a widening angle of the stub can be varied by connecting at least one second line segment.

Preferred embodiments of changeover filters according to the invention can provide at least one further stub, independently of the first and second line segments. With many embodiments, this can be a further radial stub. The latter can also be connected with a narrow end directly to the main line and can be an open circuit at a wide end. Independently of this, the radial stub can be connected to ground. With some of these embodiments, no switching elements are connected to this further stub, that is, all radial stubs of the filter need not be switchable.

Certain embodiments of changeover filters according to the invention preferably comprise a plurality of connecting points on the main line, wherein precisely one stub leads away from each of these connecting points. At least one of the stubs leading away can be a radial stub.

Some of these embodiments or alternative embodiments can provide several radial stubs of which at least two differ from one another in their length and/or their opening angle or respectively widening angle. The filter can therefore provide a plurality of differently designed radial stubs which can embody, for example, several first line segments, several second line segments and/or several other line segments without attached switching elements.

With these preferred embodiments or with other embodiments, elements can be provided along the main line, that is, in series with the main line or respectively inserted into the main line, for example, a series inductance, a series capacitance, a resistance element or several of these elements or combinations of these elements.

Embodiments of changeover filters according to the invention can preferably provide a point-symmetrical topology in which the circuit arrangement is reflected at one point. The reflection point can be disposed, for example, on the main line, for example, a point in the middle of the main line relative to the topology. Additionally or alternatively, an axial-symmetrical topology can be present. The axis of symmetry can relate to the main line as the axis of symmetry or to an axis perpendicular to the main line, which extends, for example, through the geometrical midpoint between input and output.

According to another aspect of the invention, a changeover filter for filtering out a frequency band from a signal is also proposed wherein the signal is guided via an electrical main line from an input to an output of the filter. This changeover filter comprises a radial stub which leads away from the main line. Furthermore, the filter comprises a line segment which can be electrically connected to the radial stub. At least one electronically controllable switching element is provided, by means of which the radial stub and the line segment can be connected.

According to the invention, a signal generator which comprises a changeover filter as described above or elsewhere is also proposed.

With embodiments of the invention, a filter which can be adjusted or respectively switched in a filter-internal and electronic manner is further provided. Such a filter has only a small space requirement, for example, by comparison with a conventional filter bank, and can therefore be advantageously embodied in an integrated manner or in a manner capable of integration, or integrated within a device, such as a signal generator, for example, for the RF range. Such a signal generator can be provided, for example, for the RF range, for example, the microwave range, for instance, for a corresponding test environment, such as is provided in a high-frequency laboratory.

Preferred embodiments of the proposed topologies allow cut-off frequencies in the high MHz range and in the GHz range, that is, at frequencies of, for example, up to 1 GHz or up to 10 GHz, or up to 20 GHz or more.

Conventional changeover filters in the high-frequency range are often limited in their maximal power consumption by the available high-frequency switching elements. By contrast, embodiments of changeover filters according to the invention provide a high power consumption which is not limited by the maximal current consumption and/or maximally tolerated voltage of individual switching elements. Conversely, this can also mean that, dependent upon the requirements, more cost favourable switching elements can be installed.

Inter alia, this can preferably be achieved by providing several switching elements for the current consumption or respectively current routing, instead of only one switching element, which are connected in parallel when switching and/or connected one by one when switching between different filter levels.

Embodiments of proposed topologies allow switching elements, such as diodes, to be arranged in such a manner that the occurrence of high reverse biases, which could approach the level of the breakdown voltage of the diodes can be avoided. Accordingly, higher payload frequencies can be realised and/or more cost-favourable switching elements can be installed.

Embodiments of proposed topologies allow switching elements to be arranged remote from points with a high current flow, for example, branching points from the main line or respectively connecting points to the main line. If central switching points at which several switches must engage are avoided, corresponding parasitic capacitances or inductances are also eliminated.

Embodiments of changeover filters according to the invention allow the influence of parasitic elements of the switching elements to be minimised, for example, by comparison with the reactance values of the resonators, so that interfering influences of the switching elements on the filter characteristic can be minimised.

According to different preferably embodiments of changeover filters according to the invention, the use of radial stubs is proposed. Such resonators can be designed simply and flexibly corresponding to the requirements for their capacitive and/or inductive properties, for example, according to length and widening angle. For example, an elliptical filter characteristic can be implemented simply in this manner. In this context, the radial stubs can be connected to ground. In general, in the case of filter topologies according to the invention, a plurality of differently designed radial stubs can be provided. By way of example, the applications described below relate to harmonic filters.

Radial stubs provide the advantage that they are connected at their (at least) one narrow end to a precisely defined point of the main line or respectively can be connected to the latter (in this context, "connect" is understood as an electrical connection or respectively connectability). Additionally or alternatively, one switching element or several switching elements can advantageously be provided at a wide end.

With given preferred embodiments, line segments or respectively resonators are provided, which can be expanded by means of switching elements, so that different resonance properties can be delivered in a switchable manner. During the switching, either several switches can switch substantially simultaneously, and/or three or more resonance states can be connected in succession (corresponding to successive filter levels), in that, from among two or more switches, initially only one is connected, then the next and so on. Embodiments according to the invention allow the implementation of corresponding stepped concepts in a simple manner, wherein interference caused by parasitic switching properties can be minimised and/or included in the calculations and, for example, corrected through an appropriate design of the first and/or second line segments.

With given preferred embodiments of topologies according to the invention, it is proposed that line segments, such as especially radial stubs, are arranged asymmetrically with reference to the connecting point, that is, for example, differently from a dumbbell-shaped or respectively concave arrangement of two radial stubs of identical shape arranged symmetrically to the main line as the axis of symmetry. Design options, such as the provision of only one radial stub at one connecting point, or the provision of one stub on one side of the main line and two stubs on the other side of the main line, wherein all stubs open into one and the same connecting point, and/or the provision of differently designed radial stubs on one or both sides of the main line at one connecting point, allow the properties of radial stubs to be exploited in a flexible manner.

In principle, a circuit topology need not provide any kind of symmetry. However, if symmetry is present, for example, a point symmetry and/or an axial symmetry relative to a geometric midpoint of the circuit between the input and output, it is possible to ensure that the input and output each provide the same matching. This can simplify a design process. Advantages can be gained additionally or alternatively with an altogether more balanced configuration, thereby minimising disturbances of one or more filter modes.

The invention provides a generally useful topological concept for changeover filters. Resonators can be implemented in different ways, for example, as line segments, such as radial stubs, but also line sections of constant width. The resonators can be expanded by means of switching elements. However, not only primarily capacitive or primarily inductive elements may be provided for connection. The invention is also not restricted to the connection of only complete LC elements. On the contrary, a resonator can be designed in a targeted manner with regard to its expandability, for example, by subdividing a radial stub in the form of a triangle or circular segment by means of gaps, in such a manner that the desired filter levels are obtained by connecting individual segments or several of the resulting segments. For example, by switching or respectively connection, a resonator with constant widening angle can be lengthened, and/or the widening angle can be enlarged through a connection.

The requirements, for example, for harmonic filters mean that a rather wide frequency band must be suppressed in each case around one of generally several resonance frequencies. For this purpose, line segments of corresponding width must be provided, that is, under some circumstances, line segments with a width comparable to a transmission line are too narrow. The realisation of a plurality of broadband rejection bands can be implemented in an uncomplicated manner, for example, on the basis of radial stubs.

BRIEF DESCRIPTION OF THE DRAWINGS

Further aspects and advantages of the invention are described with reference to the drawings by way of example only. The drawings show:

FIG. 3A a schematic view of a fourth exemplary embodiment of a harmonic filter;

FIG. 3B a schematic view of a fifth exemplary embodiment of a harmonic filter;

FIG. 3C a schematic view of a sixth exemplary embodiment of a harmonic filter;

DETAILED DESCRIPTION OF PREFERRED EMBODIMENTS

Figure 1:
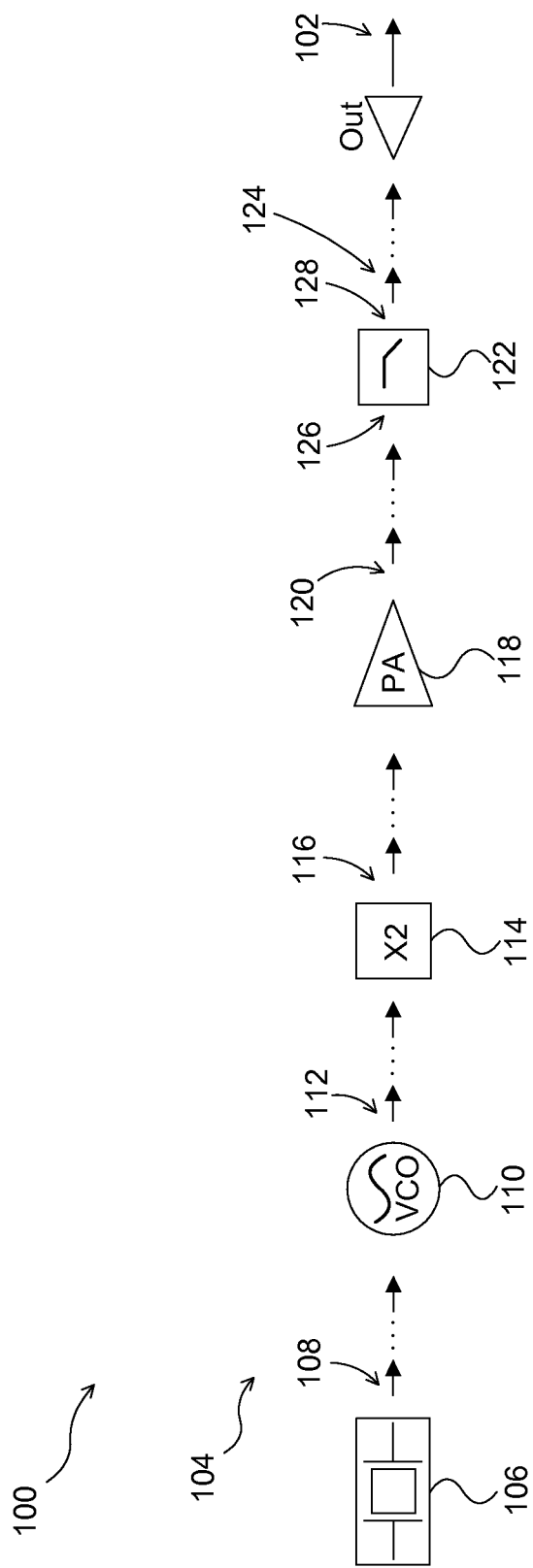
FIG. 1 an exemplary embodiment in the form of a block-circuit diagram of a signal generator with switchable harmonic filter.

FIG. 1 shows in a schematic manner functional components of an exemplary embodiment of a high-frequency or respectively microwave signal generator 100. The signal generator 100 is used to generate electromagnetic signals or respectively to transmit electromagnetic radiation 102 in the GHz range. In a special embodiment, the signal generator 100 is provided for the generation of signals within a payload frequency range from 3 GHz to 20 GHz. A frequency or respectively a frequency bandwidth of the radiation 102 generated and transmitted by the generator 100 is adjustable.

The generator 100 can be used, for example, in a test environment such as a test laboratory, and in fact, for example, for the testing of communications equipment, which is Provided for the reception and/or the transmission of signals or respectively radiation in at least one of the ranges named here.

A frequency synthesis path 104, of which only some components are shown in FIG. 1, is implemented in the microwave generator 100, that is, the path 104 can comprise further components not shown in FIG. 1.

In order to generate the high-frequency signals 102, the generator 100 comprises, inter alia, a signal source 106, for example, a quartz, for the generation of a starting signal 108. This is supplied to a voltage-controlled oscillator (VCO). The VCO 110 generates from the starting signal 108 a high-frequency signal 112. This is supplied to a frequency splitter or respectively a frequency multiplier 114, by means of which a signal 116 with a desired payload frequency bandwidth according to a current setting of the generator 100 is obtained.

An end unit of the generator 100 comprises, inter alia, an amplifier 118, for example, a power amplifier (PA), in which the high-frequency signal 116 is amplified to a required signal level. The amplified signal 120 is supplied to a harmonic filter 122 which generates a harmonic-free high-frequency signal 124. Optionally after further intermediate steps, this is output as the high-frequency signal 102.

The generator 100 comprises diverse non-linear components. These can relate, for example, to the VCO 110, the multiplier 114, and/or the amplifier 118. Such components generate not only a signal with a desired frequency, but also harmonic waves. However, extensive freedom from harmonics is a substantial requirement for equipment such as the signal generator 100 and represents, for example, a precondition for the analysis of possible harmonics of a device under test in a test environment with the minimum possible interference from superpositions caused by harmonics of the signal generator. For this reason, a harmonic filter such as the filter 122 can be provided at the positions shown in the frequency synthesis path 104. Additionally or alternatively, harmonic filters can be provided at other positions in the frequency synthesis path 104.

Because the signal generator 100 generates signals 102 with adjustable frequency or respectively adjustable frequency band, the harmonic filter 122 must also be adjustable, so that only the harmonics and not the fundamental wave are attenuated or respectively filtered out. Conventionally, a filter like the filter 122 can be realised, for example, in the form of a filter bank with a plurality of fixed filters of which precisely one can be selected by means of changeover switches. In the following, exemplary embodiments of changeover filters according to the invention which have a smaller space requirement than a filter bank are described. In this context, a cut-off frequency is switched in an electronic and filter-internal manner. Accordingly, for example, mechanical changeover switches with a high insertion loss can be dispensed with.

Figure 2A:
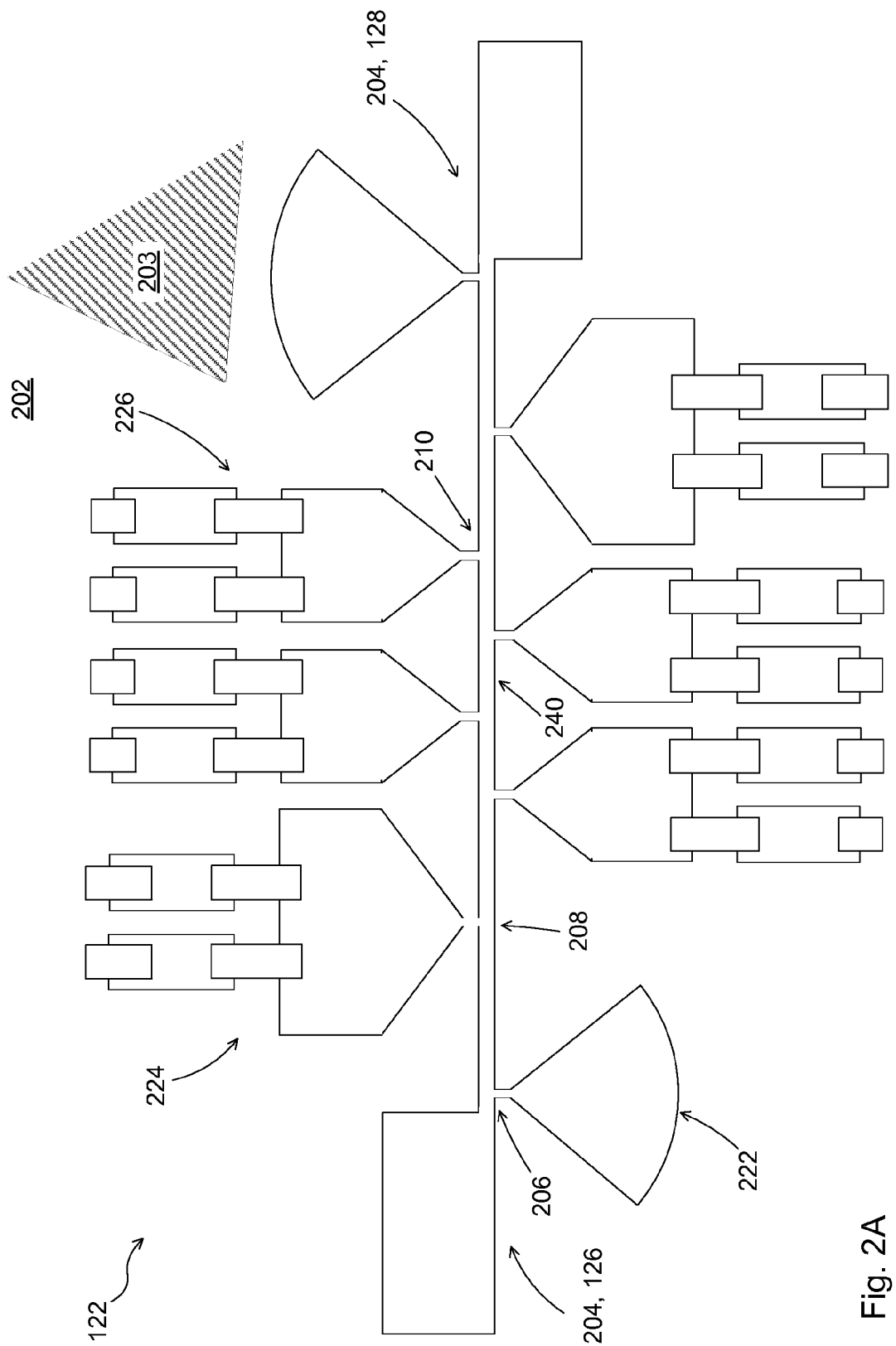
FIG. 2A a plan view of the circuit topology of a first exemplary embodiment of the harmonic filter from FIG. 1.

FIG. 2A shows a plan view of an exemplary embodiment according to the invention for a changeover switching topology, such as could be installed in the harmonic filter 122 from FIG. 1. Accordingly, the filter 122 can be realised as a circuit on a substrate 202, for example, a ceramic substrate. A ground 203, for example, a copper layer, can be provided below the substrate. An electrical main line 204 which transmits a signal from an input 126 of the filter 122 to an output 128, is provided on the substrate 202, compare also with FIG. 1. The main line 204 can have properties of an HF transmission line, as is evident to the person skilled in the art of HF technology. For example, the main line 204 can be realised as a microstrip line.

Resonance structures, such as the structures 222, 224 and 226, are electrically connected to the main line 204 at a plurality of connecting points, of which only a few have been provided with a reference numbers 206, 208 and 210 for reasons of visual clarity. Dependent upon design and positioning along the main line 204, each of the structures 222-226 realizes at least one resonance frequency. The signal of the main line 204 is attenuated in a frequency range around the respective resonance frequency. Some of the structures, for example, those with the reference numbers 224 and 226, are provided with switches, so that different resonance frequencies can be realised in a switchable manner.

By way of example, the structure 226 will initially be described with reference to FIG. 2B; however, this description also applies by analogy to the other structures, for example, those with the reference number 224, unless otherwise explicitly stated. The (switchable) resonator structures shown here and in the subsequent Figs. can, however, also quite generally represent a part of a more comprehensive harmonic filter, or can form an independent harmonic filter.

The structure 226 comprises a first line segment 252 and two second line segments 254, 256. The line segments 252, 254, 256 can be manufactured with the same technology as the main line 204, for example, as a conductive layer on the substrate 202. However, the first and second line segments 252, 254, 256 are not generally conceived of as simple high-frequency transmission lines. It is directly evident from FIG. 2B that the line segments 252, 254, 256 have a greater width than the main line 204. A line width 258 of the first line segment 252 is not constant along a course 260, but increases.

The topology shown in FIG. 2A realizes an elliptical filter characteristic. The resonance structures 222, 224, 226 etc. each additionally implement an optionally switchable (R)LC structure. In the example in FIG. 2B, the line segments 252, 254, 256 are connected to ground. This is not explicitly visible in the schematic plan view, however, a ground connection can be given through the type of implementation, in which, for example, the segments 252, 254, 256 are applied according to the technique of microstrip lines and, for example, the copper plate 203 is connected to ground on the underside of the substrate 202.

The first line segment 252 leads away from the main line 204, that is, the segment 252 is permanently electrically connected to the main line 204 only at the connecting point 210. The second line segments 254, 256 can be connected to the main line 204 via the first line segment 252. For this purpose, the second line segments 254, 256 can be electrically connected to the first line segment 252. In the case of the exemplary embodiment described here, two switches 262 and 264 are provided for this purpose. Each switching element realizes a current connection independently of the other switching element.

In concrete terms therefore, each switching element is directly connected to the first line segment 252, that is, dependent upon the switching state, the switching element 262 can electrically connect the line segment 254 to the line segment 252, and, dependent upon the switching state, the switching element 264 can electrically connect the line segment 256 to the line segment 252.

The switching elements can be electronically biased. Each of the switching elements 262 and 264 can be realised, for example, as a PIN diode. However, other implementations are also conceivable, for example, of one or more FETs or other transistors. The biasing circuit 282 for the biasing of the switching elements has only been suggested in FIG. 2B for reasons of visual clarity, but will be discussed in greater detail below with reference to FIG. 6.

The switching elements 262, 264 can be biased individually and/or in parallel, that is, either only one switching element can be switched in order to connect the respective second line segment to the first line segment, or both switching elements can be switched substantially simultaneously in order to connect both second line segments to the first line segment 252.

The line segments act as a resonator individually and also in combination, wherein the resonance frequency differs dependent upon the switching state of the switches. The first line segment 252 represents an LC resonance circuit and is permanently connected to the main line 204 via the connecting point 210, so that, with open switches 262, 264, a first attenuation frequency or respectively resonance frequency is realised. If one or both of the switches is closed, a second or third frequency can be realised, wherein, given the identical design of the second line segments shown here, the resonance frequencies do not differ substantially in each case with one closed switch and one open switch (or vice versa).

The first line segment 252 provides a radial stub 268, wherein, along its length 260, the stub 268 widens in its width 258. Radial stubs are known to the person skilled in the art as such. In the present case, it is suggested, for example, that elliptical filter-transmission functions can also be advantageously realised with radial stubs. As discussed above, the stubs in the present case are connected to ground, but are still designated as stubs ("Stub").

Radial stubs generally have at least one narrow end and at least one wide end. The radial stub 268 is rigidly connected with its narrow end 270 to the connecting point 210 of the main line 204. No switches or further resonators are provided at the point 210, so that, for example, by comparison with a star node, this point can be designed to be small, and interfering parasitic effects can be minimised.

Figure 2B:
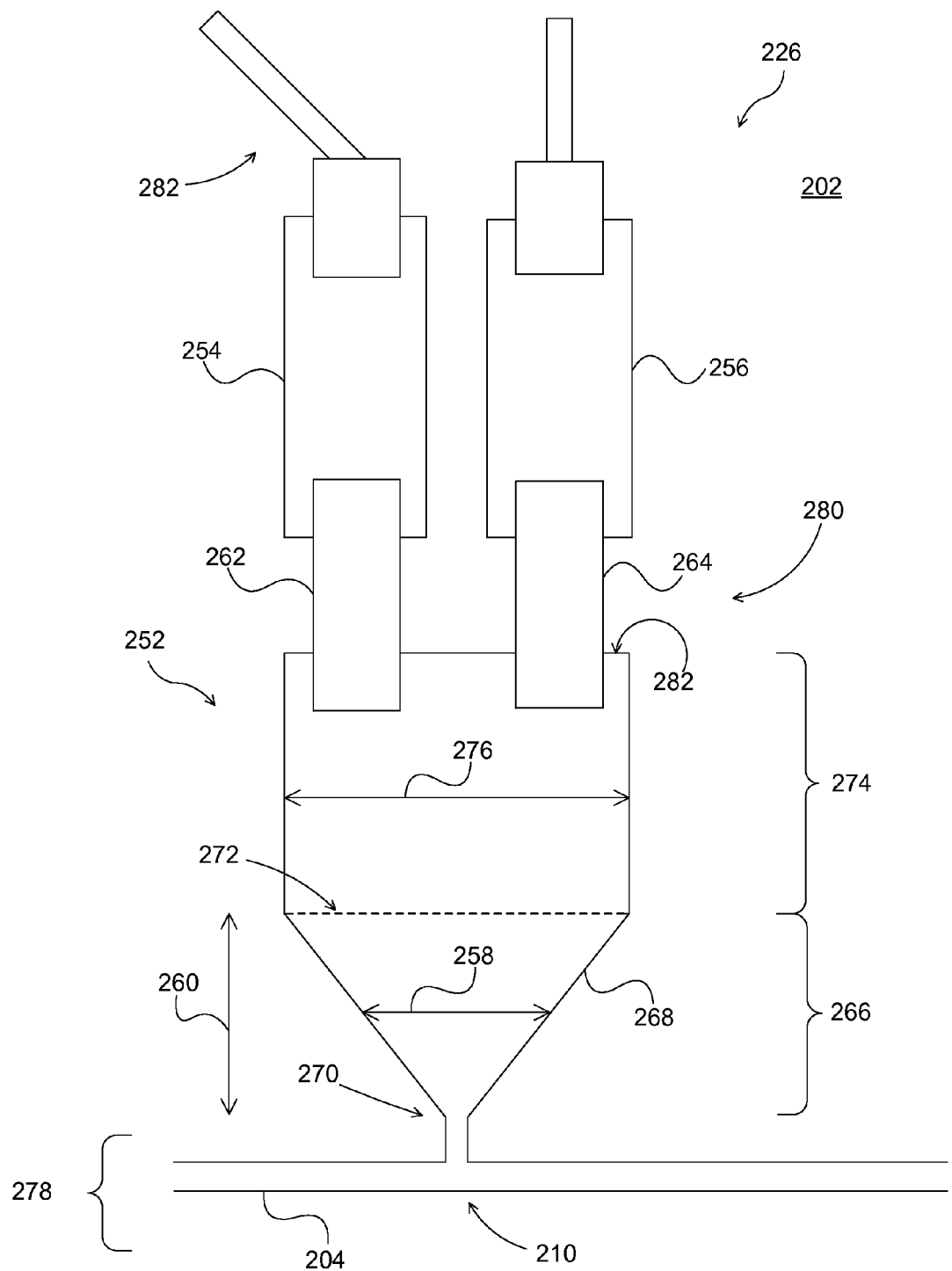
FIG. 2B a schematic view of a second exemplary embodiment of a harmonic filter.

In this exemplary embodiment, the radial stub 268 has the shape of a triangle with a rectilinear wide end 272, which is suggested in FIG. 2B with a dashed line. The wide end 272 of the radial stub 268 is lengthened, that is, the radial stub 268 opens with its wide end 272 into a line element 274 with a constant width 276. The width 276 is larger than the width 278 of the main line 204.

As shown, the implementation of LC resonators by means of radial stubs allows the provision of several switching elements at the already wide end of such stubs. In this context, the line element 274 lengthens the wide end 272 of the radial stub 268 in such a manner that sufficient supporting space is available for the switching elements 262 and 264.

The radial stub 268 ends with a rectilinear wide end 282 of the line element 274. The line segments 254 and 256 are embodied as wide line sections. A gap 280 without assignment is disposed between the first line segment 252 and the second line segments 252, 256. The gap 280 is bridged selectively by the switching elements 262 and 264. The segments 252, 254, 256 are designed in an appropriate manner for the desired interplay; accordingly, the common or respectively separate connection of the further line segments 254 and 256 changes the resonance frequency of the first line segment or respectively resonator 252 in such a manner that the further desired resonance frequencies and bandwidths are obtained.

In FIG. 2B, the gap 280 subdivides the line segments 252, 254 and 256 precisely in such a manner that, with connected segments 254, 256, the radial stub 268 is lengthened not only by the line element 274, but also by the length of the line sections 254, 256, with corresponding capacitive or respectively inductive effects, that is, apart from the widening in the front region 266, a wide strip line is provided by comparison with the main line 204.

Figure 2C:
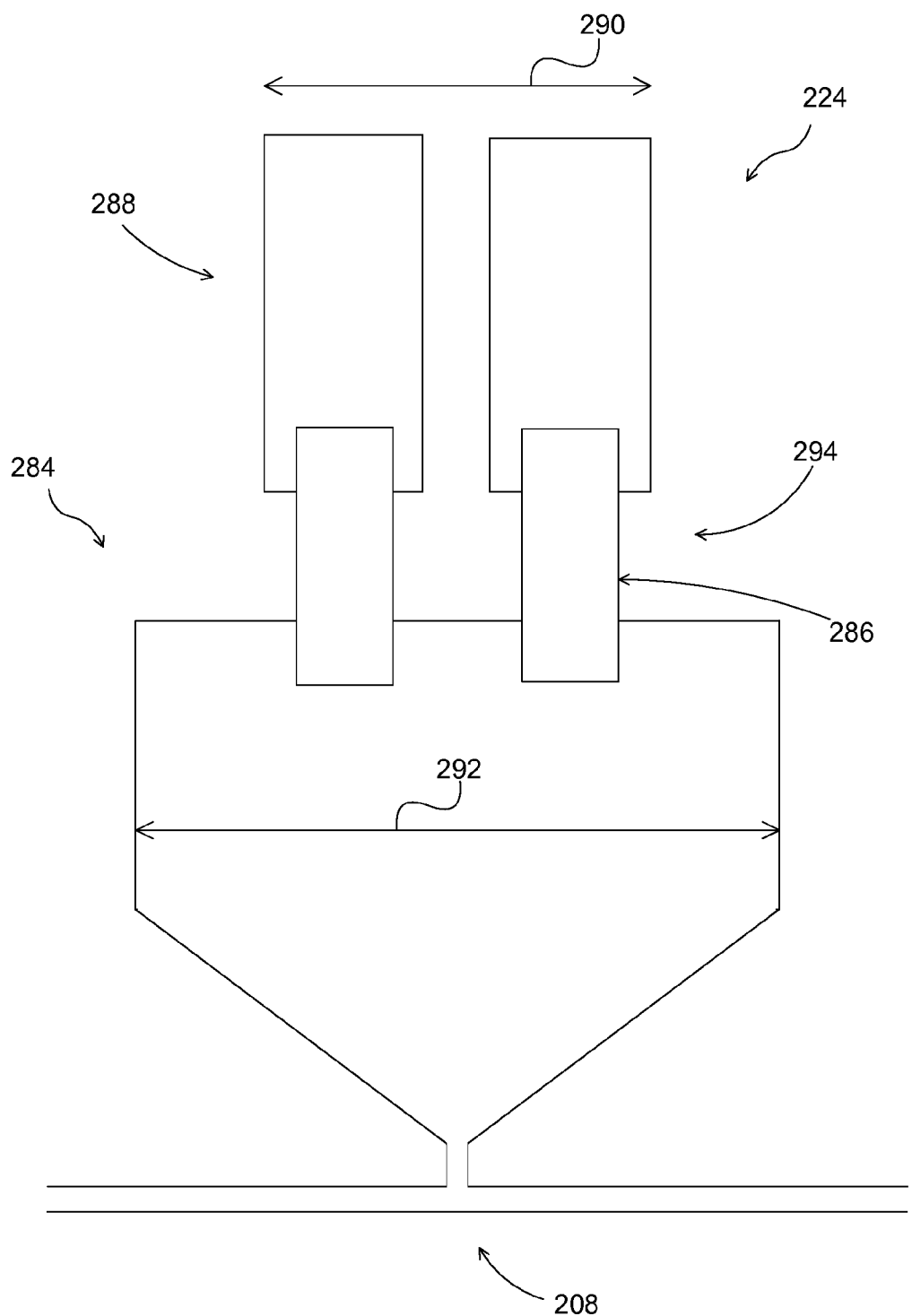
FIG. 2C a schematic view of a third exemplary embodiment of a harmonic filter.

However, other resulting geometric shapes are also conceivable for the interconnected first and second line segments. For example, the resonator structure 224 in FIG. 2A shows a wide radial stub, once again with an adjacent narrower strip width (connectable). The resonator structure 224 is reproduced schematically in FIG. 2C. As in FIG. 2B, the first line segment 284 is realised by a radial stub with lengthened wide end, and two separate second line segments 288, each individually connectable with switching elements 286, are provided. However, here, a width 290 of the interconnected second line elements is smaller than the width 292 of the wide end of the radial stub 284. However, here also, the gap 294 between the first 284 and the two second 282 line segments extends in a straight line.

FIG. 3A shows schematically a further resonator structure 300 for use in a filter. In the following, only selected aspects of the structure 300 will be discussed; aspects not mentioned explicitly generally correspond approximately to what has been stated with regard to other exemplary embodiments.

A first line segment 306 is connected via a permanent connecting point 304 to a main line 302. Here, the segment 306 comprises a radial stub in the shape of a circular sector, that is, the line segment 306 has a curved wide end 308. A second line segment 312 is provided behind a gap 310 which extends correspondingly with constant curvature and constant width. The latter has the shape of an annular segment such that, in the case of the interconnection of the two line segments 306 and 312 by means of switching elements 318, a lengthened radial stub is obtained, that is, a length 314 of the stub 306 can be lengthened in a switchable manner to a length 316, with corresponding change of the resonance frequency.

Once again, as suggested by the dots, at least one further line segment could adjoin the second line segment 312 in a switchable manner, for example, once again, in the shape of an annular segment, which would lead to a further lengthening of the radial stub 306.

In the present example, the gap 310 is bridged by three switching elements 318. Instead of three elements, however, less or more switching elements could also be provided. Since all of the switches connect to the line segment 312, in the case of a changeover, that is, connection of the second segment 312 to the first segment 306, all of the switching elements 318 should connect as simultaneously as possible. Corresponding control circuits will be discussed below.

FIG. 3B shows yet another resonator structure 330. This comprises a first line segment 332 embodied as a radial stub, which can be identical to the segment 306 from FIG. 3A. However, instead of a single, second line segment behind a curved gap 334, two further line segments 336 are provided, between which a gap 338 remains. Each of the segments 336 can be connected separately by at least one specially allocated switch 340 to the radial stub 332, in an analogous manner to that discussed with reference to the second line segments 254, 256 in FIG. 2B.

The two resonators 336 can be electromagnetically coupled to one another via the gap 338. With other exemplary embodiments, active or passive switching elements can be provided for the coupling of parallel resonators like the resonators 336.

By means of the two switches 340, the structure 330 allows the switching between three different resonator frequencies, as discussed with reference to the configuration from FIG. 2B. If the second line segments 336 were designed differently rather than identically, with a total of three line segments, as many as four switching steps would be conceivable. The different design can comprise an assignment area and/or a different geometric shape with correspondingly different effects on the resonance frequency.

As suggested by the dots in FIG. 3B, at least one further line segment could adjoin the second line segments 336 in a switchable manner. For example, a single segment which limits the gap 338 could be provided, or two (or three, or more) segments could be provided. Like the segments 336, these could lengthen the radial stub 332, or could realise a larger or smaller overall widening.

FIG. 3C shows a resonator structure 350. The latter comprises a first line segment 352 embodied as a radial stub. This has the shape of a triangle with a rectilinear wide end comparable with the stub 268 from FIG. 2B, however, without an adjoining line section of constant width. After a rectilinear gap 354, a second line segment 356 adjoins the stub 352. This is embodied in a trapezoidal shape in such a manner that, after the connection of the segment 356 by means of at least one switching element 358, a lengthened triangle with a constant widening angle is obtained from the triangle 352, with a corresponding change in resonance frequency. Here also, a further line segment, for example, also a trapezoidal line segment, could adjoin in a switchable manner.

Figure 4:
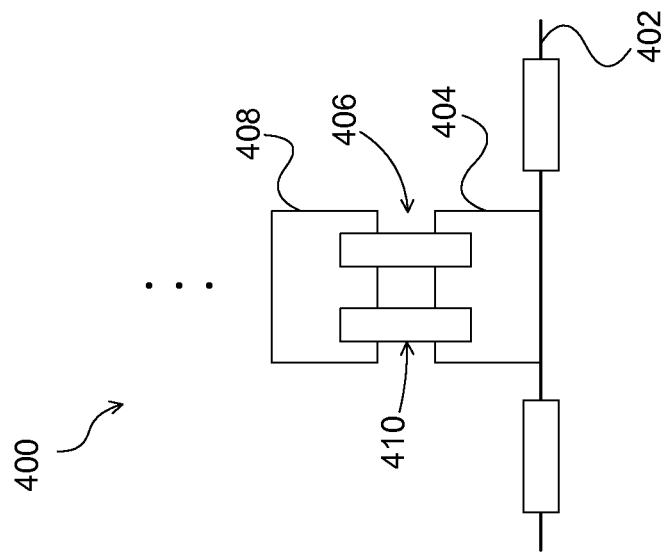
FIG. 4 a schematic view of a seventh exemplary embodiment of a harmonic filter.

FIG. 4 shows a resonator structure 400 which is connected to a main line 402 and comprises a first line segment 404. The segment 404 here has a rectangular assignment. Accordingly, the segment is connected in a linear manner to the main line 402 along one of its sides, instead of only via a connecting point, as in the previously described examples.

A second line segment 408 which can, be connected via a switch 410 to the first segment 404 is disposed behind a gap 406. The segments 404 and 406 form a stub widened by comparison with the transmission line 402, and of constant width without initial widening and with adjustable length.

The two-dimensional connection to the main line 402 can prevent interference which could occur if the segment 404 were to be connected to the main line 402 via a transmission line comparable to the former.

Figure 5:
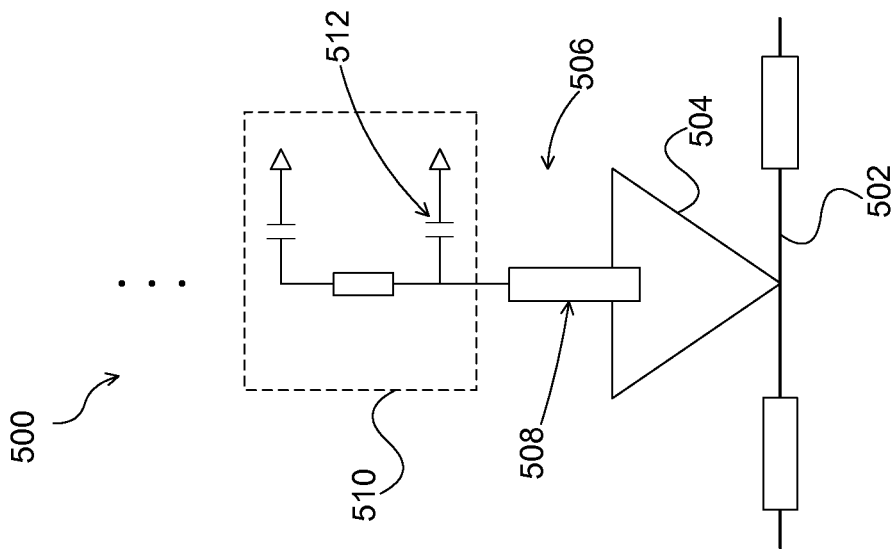
FIG. 5 a schematic view of an eighth exemplary embodiment of a harmonic filter.

FIG. 5 shows a resonator structure 500 in a main line 502 with a first line segment 504 which is embodied as a radial stub 504 of triangular shape connected by point connection to the main line 502. A gap 506 is bridged by a switching element 508. A second line segment 510 is provided in a correspondingly switchable manner behind the gap 506. Here, this comprises an electronic circuit which is suggested schematically. The circuit can comprise, for example, inductive and/or capacitive elements, thereby realising, for example, an (R)LC circuit or elements thereof.

Figure 6:
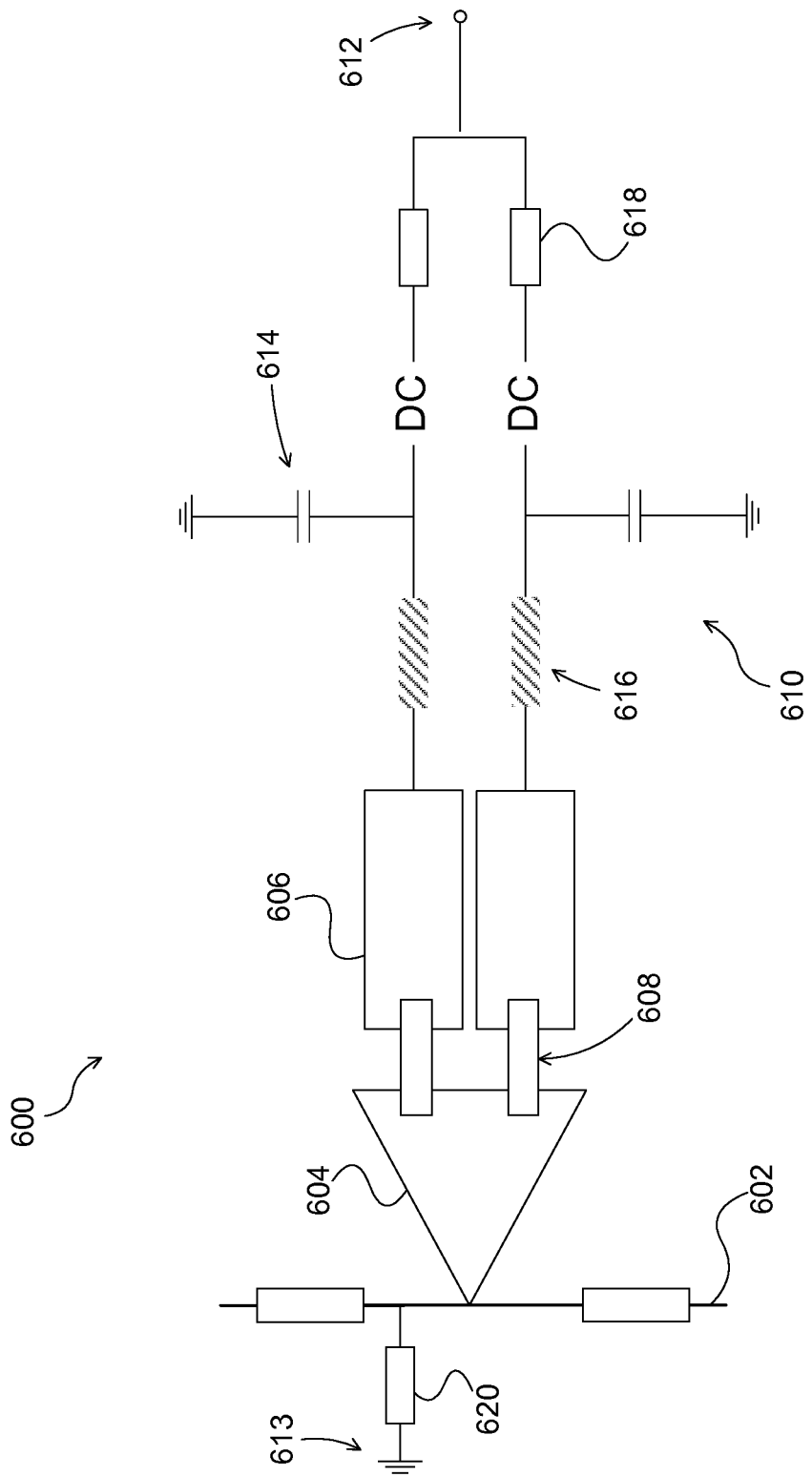
FIG. 6 a schematic view of a biasing circuit for switching elements.

FIG. 6 shows a resonator structure 600, in which a first line segment 604 connected by point connection to a main line 602 is present in the form of a radial stub. Second line segments 606 can be connected in a switchable manner via switching elements 608. By way of example, it is assumed that the switching elements 608 are PIN diodes. A control circuit 610 is provided for the biasing of the switching elements 608.

The biasing circuits for the two PIN diodes have a common. DC voltage source 612 ("Direct Current", DC). In the example of FIG. 6, the control DC voltage is applied to the switching elements 608 via the second line segments 606. The DC voltage 612 should be separated using appropriate means from the high-frequency HF of the main line 602. In the example of FIG. 6, the main line 602 for a DC voltage, the DC voltage 612, is connected to ground here, as indicated by the ground symbol 613. The decoupling from the high-frequency takes place with an appropriately designed coil 620. The coil 620 can be positioned anywhere along the main line 602.

The biasing circuit 610 comprises capacitive 614 and inductive 616 elements in each case separately for each of the switches 608. In a real implementation, the capacitances 614 can be realised beneath the circuit level illustrated in FIG. 6. In this context, the biasing of the PIN diodes should be understood as a part of the connected resonators, that is, of the second line segments 606, for example, with regard to capacitive and/or inductive effects. This aspect must be taken into consideration in the design of the segments 606 with regard to the desired attenuation or respectively filter effects.

The configuration presented can be designed in such a manner that both switches 608 are switched simultaneously. For example, appropriate resistors 618 can be provided to ensure that the switches 608 connect as simultaneously as possible. Additionally or alternatively to the resistors 618, resistors can also be provided between the inductive 616 and capacitive 614 elements. For example, undesired resonances of the biasing circuit can be attenuated in this manner.

Biasing circuits comparable to the circuit 610 in FIG. 6 can be provided for the resonators of the other exemplary embodiments described here, even if such biasing circuits have generally been omitted in part or in their entirety from the drawings. While only one resonator structure with the first line segment 604 and second line segments 606 is switched by the same DC voltage source 612 in the example of FIG. 6, more than just one resonator structure can be biased from a single DC voltage source in other exemplary embodiments. The two, three or more resonator structures can be connected jointly. Alternatively, different biasings can be realised, for example, through an appropriate selection of resistors comparable to the resistors 618. Other possibilities are obvious to the person skilled in the art, wherein other passive or active components can be used alternatively or additionally.

Even if switching elements other than PIN diodes are used, biasing circuits with elements and/or effects comparable to those in the circuit 610 shown in FIG. 6 are conceivable.

Figure 7A:
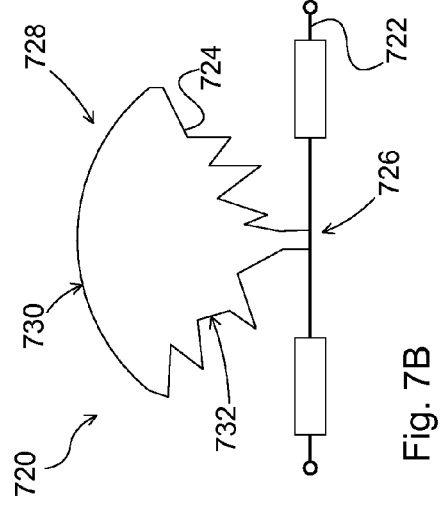
FIG. 7A a schematic view of a first exemplary embodiment of a resonator structure.

FIG. 7A shows a resonator structure 700 which is connected to a main line 702 and comprises a first line segment in the form of a radial stub 704. Optional further line segments have been omitted in the drawings. The stub 704 has a narrow end 706 and a wide end 708. The stub 704 is connected to the main line via its narrow end 706. The limit 710 of the assignment 704 disposed opposite to the main line 702 is curved in a convex manner in the example of FIG. 7A; a concave curve would also be possible as an alternative. The segment 704 has a mushroom-shaped assignment with concave curved edges 712. Convex edges are also possible in alternative exemplary embodiments.

Figure 7B:
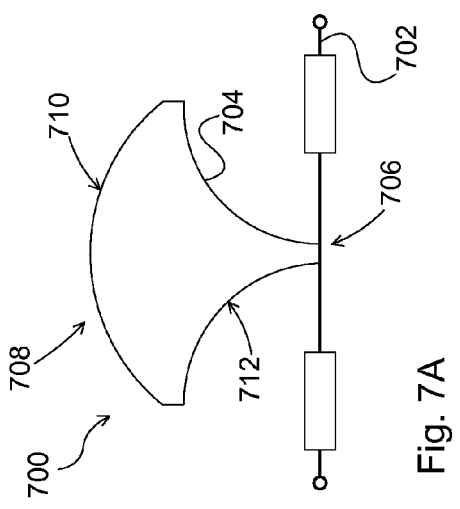
FIG. 7B a schematic view of a second exemplary embodiment of a resonator structure.

FIG. 7B shows a further resonator structure 720 which is connected to a main line 722 and comprises a first line segment in the form of a radial stub 724. Optional further line segments have been omitted in the drawings. The stub 724 has a narrow end 726 and a wide end 728. The stub 724 is again connected to the main line via its narrow end 726. The limit 728 of the assignment 724 disposed opposite to the main line 722 in the example of FIG. 7B is curved in a convex manner 730; a concave curvature would also be possible as an alternative. Further edges 732 of the segment 724 are shaped in a random or respectively irregular or discontinuous manner with abrupt changes. This form of radial stub also provides a functional resonator structure, that is, the term "radial stub" as used in the present context should include structures such as those shown by way of example in FIG. 7B.

Figure 7C:
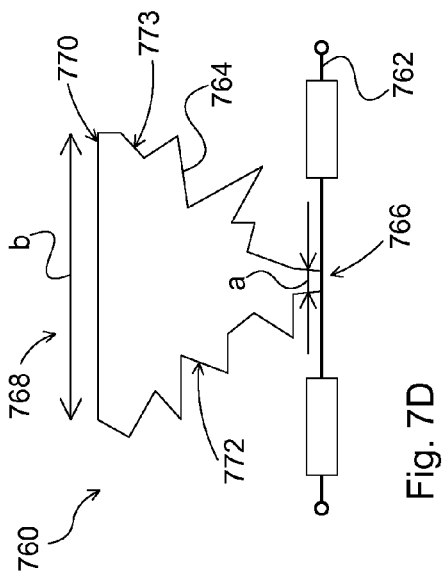
FIG. 7C a schematic view of a third exemplary embodiment of a resonator structure.

FIG. 7C shows yet another resonator structure 740, which is connected to a main line 742 and comprises a first line segment in the form of a radial stub 744. Optional further line segments have been omitted in the drawings. The stub 744 again has a narrow end 746 and a wide end 748 and is connected via its narrow end 746 to the main line 742. In the radial stub 744, the widening from the narrow 746 end to the wide 748 end does not take place in a continuous manner as, for example, in FIGS. 3A-3C and 7A, but in a discontinuous manner with an abrupt change at the position 750. Here also, a functional resonator structure is obtained; the term "radial stub" should include structures such as those shown in FIG. 7C.

Figure 7D:
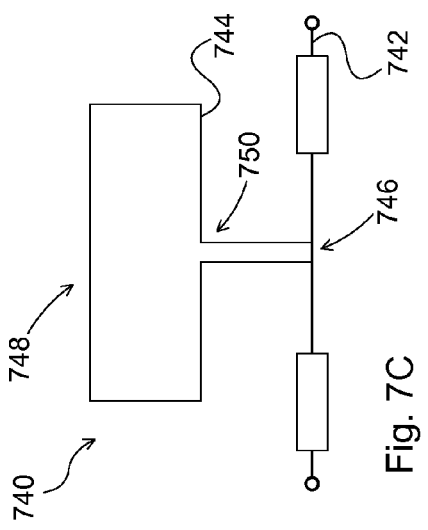
FIG. 7D a schematic view of a first exemplary embodiment of a resonator structure.

FIG. 7D shows a further resonator structure 760 which is connected to a main line 762 and comprises a first line segment in the form of a radial stub 764. Optional further line segments have been omitted in the drawings. The stub 764 has a narrow end 766 and a wide end 768. The stub 764 is again connected to the main line 762 via its narrow end 766. In the example of FIG. 7D, the limit 770 of the assignment 764 disposed opposite to the main line 762 is provided by a straight contour line; curves would also be possible, as an alternative, as, for example, in FIGS. 7A and 7B.

Other edges 772, 773 of the segment 764 are shaped in an irregular or respectively discontinuous manner and are, for example, also not symmetrical relative to one another, that is, each of the contour lines 772 and 773 extends in an individually irregular manner. This form of radial stub also provides a functional resonator structure, that is, the term "radial stub" as used in the present context should include structures such as those shown by way of example in FIG. 7D.

In general, the term "radial stub" should include any stub which, as suggested in the example of FIG. 7D, provides an end 766 with a line width a, and an end 768 with a line width b, wherein b>a. In this context, the assignment between a and b or respectively between the narrow end 766 and the wide end 768 can be embodied arbitrarily within wide limits, for example, adjacent structures, such as adjacent resonator structures can be taken into consideration in this context.

In FIG. 2A, resonators like the resonator 222 are connected to the main line 204 via connecting points like the point 206. In each case, the resonator 222 comprises a radial stub which is connected at its narrow end to the main line 204. The radial stubs are open at their wide end, that is to say, no switches are provided for the selective connection of further resonance structures. The stub 222 can be connected to ground. The open stub 222 can be provided close to one end of the main line 204, that is, close to the input 126 (or output 128).

The topology shown in FIG. 2A comprises a plurality of radial stubs, such as the structures designated with the numbers 222, 224 and 226, which differ from one another in resonance-relevant aspects such as their length and/or their widening angle. Accordingly, for example, the resonance structure 224 has a wider opening angle than the structure 222, and the latter, in turn, has a wider opening angle than the structure 226. As a result of the respective switching elements, resonators such as the resonators 224, 226 are adjustable in their length or respectively adjustable to different lengths.

The topology in the FIG. 2A is point-symmetrical about a point 240 on the main line 204. The symmetrical assignment leads to a minimisation of disturbances such as those which can result from an irregular assignment. A point-symmetrical topology can also provide advantages by comparison with an axial-symmetrical topology.

Accordingly, a plurality of connecting points are provided on the main line 204, for example, points 206, 208, 210. For every resonator on one side of the main line, axial symmetry would require an identical resonator on the other side. However, if only one resonator must or can lead away from every connecting point or if resonators connected independently from one another via a common connecting point can be designed, possible configurations of resonator elements, such as radial stubs, can be used considerably more flexibly.

In addition to the resonators connected via the connecting points, other electrically active elements can be associated with the main line. As shown, for example, in FIG. 3A, series inductances and/or series capacitances 320 and 322 can be connected in series to the main line or respectively integrated in the main line.

The invention is not restricted to the exemplary embodiments described here and the aspects emphasised in this context; on the contrary, within the scope indicated by the dependent claims, a plurality of variations, which are disposed within scope of activity of the person skilled in the art, are possible. In particular, given combinations of features described separately above are evident to the person skilled in the art as expedient or advantageous.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A changeover filter for filtering out a variable frequency band from a signal which is guided via an electrical main line from an input to an output of the filter, the changeover filter comprising:
  a first line segment, which leads away from the main line, and at least one second line segment which can be electrically connected to the first line segment; and
  at least two electronically controllable switching elements, by which the first and the at least one second line segment can be connected,
  wherein at least one line segment provides a radial stub with a narrow end and a wide end,
  wherein a plurality of second line segments can be connected separately to the first line segment, in each case via at least one switching element, and
  wherein a topology of the changeover filter is point-symmetrical about a point on the main line.

2. The changeover filter according to claim 1,
  wherein the first line segment provides a radial stub which is rigidly connected at the narrow end to a connecting point of the main line.

3. The changeover filter according to claim 2,
  with an asymmetric topology relative to the connecting point.

4. The changeover filter according to claim 1,
  wherein the at least two switching elements are each connected separately to the wide end of the radial stub.

5. The changeover filter according to claim 1,
wherein, in its course from the narrow end to the wide end, a line width of the radial stub widens continuously or discontinuously.

6. The changeover filter according to claim 5,
wherein the wide end of the radial stub is embodied as a line segment of constant width.

7. The changeover filter according to claim 5,
wherein, behind the curved wide end of the radial stub, the second line segment is embodied as an annular segment and/or wedge-shaped section.

8. The changeover filter according to claim 7,
wherein, behind the curved wide end of the radial stub, several second line segments are arranged in the form of mutually adjacent circular segments, and each circular segment can be connected to the radial stub via at least one switching element.

9. The changeover filter according to claim 5,
wherein, behind the rectilinear wide end of the radial stub, the second line segment is arranged as a line section or a trapezoidal line segment.

10. The changeover filter according to claim 1,
with several radial stubs, which differ from one another in their length and/or their widening angle.

11. The changeover filter according to claim 1,
wherein at least one switching element is or provides a PIN diode.

12. The changeover filter according to claim 1,
with a biasing circuit for the controlling of at least one of the switching elements via the second line segment.

13. A changeover filter for filtering out a frequency band from a signal which is guided via an electrical main line from an input to an output of the filter, the changeover filter comprising:
 a radial stub which leads away from the main line and a line segment which can be electrically connected to the radial stub, wherein the radial stub has a narrow end and a wide end; and
 at least one electronically controllable switching element, by which the radial stub and the line segment can be connected,
 wherein a plurality of line segments are connectable separately to the radial stub, in each case via at least one switching element, and
 wherein a topology of the changeover filter is point-symmetrical about a point on the main line.

* * * * *